(12) United States Patent
Xie et al.

(10) Patent No.: US 7,161,243 B2
(45) Date of Patent: Jan. 9, 2007

(54) SYSTEM AND APPARATUS FOR SOCKET AND PACKAGE POWER/GROUND BAR TO INCREASE CURRENT CARRYING CAPACITY FOR HIGHER IC POWER DELIVERY

(75) Inventors: Hong Xie, Phoenix, AZ (US); Brent Stone, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/133,999

(22) Filed: May 20, 2005

(65) Prior Publication Data
US 2005/0208791 A1 Sep. 22, 2005

Related U.S. Application Data

(63) Continuation of application No. 09/753,327, filed on Dec. 30, 2000, now Pat. No. 6,992,378.

(51) Int. Cl.
| | |
|---|---|
| H01L 29/10 | (2006.01) |
| H01L 23/48 | (2006.01) |
| H01L 21/66 | (2006.01) |
| H05K 5/06 | (2006.01) |
| H05K 7/14 | (2006.01) |
| G01R 31/26 | (2006.01) |

(52) U.S. Cl. .................. 257/727; 257/48; 257/777; 257/778; 438/14; 361/759; 361/801; 324/252; 324/719; 324/765

(58) Field of Classification Search .................. None
See application file for complete search history.

(56) References Cited

U.S. PATENT DOCUMENTS

| | | | |
|---|---|---|---|
| 3,582,865 A * | 6/1971 | Franck et al. ................ 439/67 |
| 4,035,046 A | 7/1977 | Kloth | |
| 4,530,002 A | 7/1985 | Kanai | |
| 4,630,875 A | 12/1986 | Korsunsky et al. | |
| 4,633,239 A * | 12/1986 | Nalbanti ................. 340/636.1 |
| 4,814,857 A | 3/1989 | Werbizky | |
| 5,043,845 A | 8/1991 | McDermott et al. | |
| 5,158,470 A | 10/1992 | Zarreii | |
| 5,205,742 A * | 4/1993 | Goff et al. ................. 439/73 |
| 5,290,193 A * | 3/1994 | Goff et al. ................. 439/331 |
| 5,348,489 A | 9/1994 | Yeh | |
| 5,365,686 A | 11/1994 | Scott | |
| 5,448,449 A | 9/1995 | Bright et al. | |
| 5,489,217 A * | 2/1996 | Scheitz et al. ............. 439/342 |
| 5,578,870 A * | 11/1996 | Farnsworth et al. ........ 257/727 |
| 5,610,801 A | 3/1997 | Begis | |
| 5,721,673 A * | 2/1998 | Klein ..................... 361/809 |

(Continued)

FOREIGN PATENT DOCUMENTS

FR 2 722 334 1/1996

(Continued)

*Primary Examiner*—Carl Whitehead, Jr.
*Assistant Examiner*—James Mitchell
(74) *Attorney, Agent, or Firm*—Blakely, Sokoloff, Taylor & Zafman LLP

(57) ABSTRACT

A socket and package apparatus are disclosed for increasing the amount of power that can be delivered from an IC board to an IC where the IC package is mounted in a socket connected to the IC board. In one embodiment, the IC package includes a first power plane along with a power carrier and one or more pin receptacles. The power bar carrier includes a first conducting panel that is electrically coupled to the first power plane along a first adjacent edge. The first conducting panel is also electrically coupled to a first plurality of conducting pads.

10 Claims, 13 Drawing Sheets

U.S. PATENT DOCUMENTS

| | | |
|---|---|---|
| 5,821,614 A | 10/1998 | Hashimoto et al. |
| 5,864,478 A | 1/1999 | McCutchan et al. |
| 5,883,790 A | 3/1999 | Klein |
| 5,892,275 A | 4/1999 | McMahon |
| 5,967,802 A | 10/1999 | Daly et al. |
| 5,980,267 A | 11/1999 | Ayers et al. |
| 5,994,774 A * | 11/1999 | Siegel et al. .................. 257/727 |
| 6,028,770 A | 2/2000 | Kerner et al. |
| 6,210,175 B1 | 4/2001 | Payne |
| 6,219,241 B1 | 4/2001 | Jones |
| 6,224,404 B1 | 5/2001 | Sauer |
| 6,243,267 B1 * | 6/2001 | Chuang ....................... 361/704 |
| 6,262,581 B1 | 7/2001 | Han |
| 6,297,654 B1 * | 10/2001 | Barabi ........................ 324/755 |
| 6,381,836 B1 | 5/2002 | Lauruhn et al. |
| 6,392,295 B1 | 5/2002 | Iwaya et al. |
| 6,437,435 B1 | 8/2002 | Kinsman et al. |
| 6,477,286 B1 | 11/2002 | Ouchi |
| 6,486,690 B1 * | 11/2002 | Takagi et al. ................ 324/763 |
| 6,629,181 B1 | 9/2003 | Alappat et al. |
| 6,672,912 B1 | 1/2004 | Figueroa |
| 6,756,666 B1 | 6/2004 | Hosomi |
| 6,992,378 B1 * | 1/2006 | Xie et al. .................... 257/700 |
| 2002/0000645 A1 | 1/2002 | Sato et al. |
| 2002/0066951 A1 * | 6/2002 | Li et al. ...................... 257/691 |
| 2002/0076966 A1 * | 6/2002 | Carron et al. ................ 439/330 |
| 2004/0100778 A1 | 5/2004 | Vinciarelli et al. |

FOREIGN PATENT DOCUMENTS

| | | |
|---|---|---|
| JP | 63 280432 | 11/1988 |
| JP | 404236480 | 8/1992 |
| JP | 08-138814 | 5/1996 |
| JP | 2000-456833 | 6/2000 |
| WO | WO 99 41731 | 8/1999 |
| WO | PCT/US 01/44828 | 11/2001 |

* cited by examiner

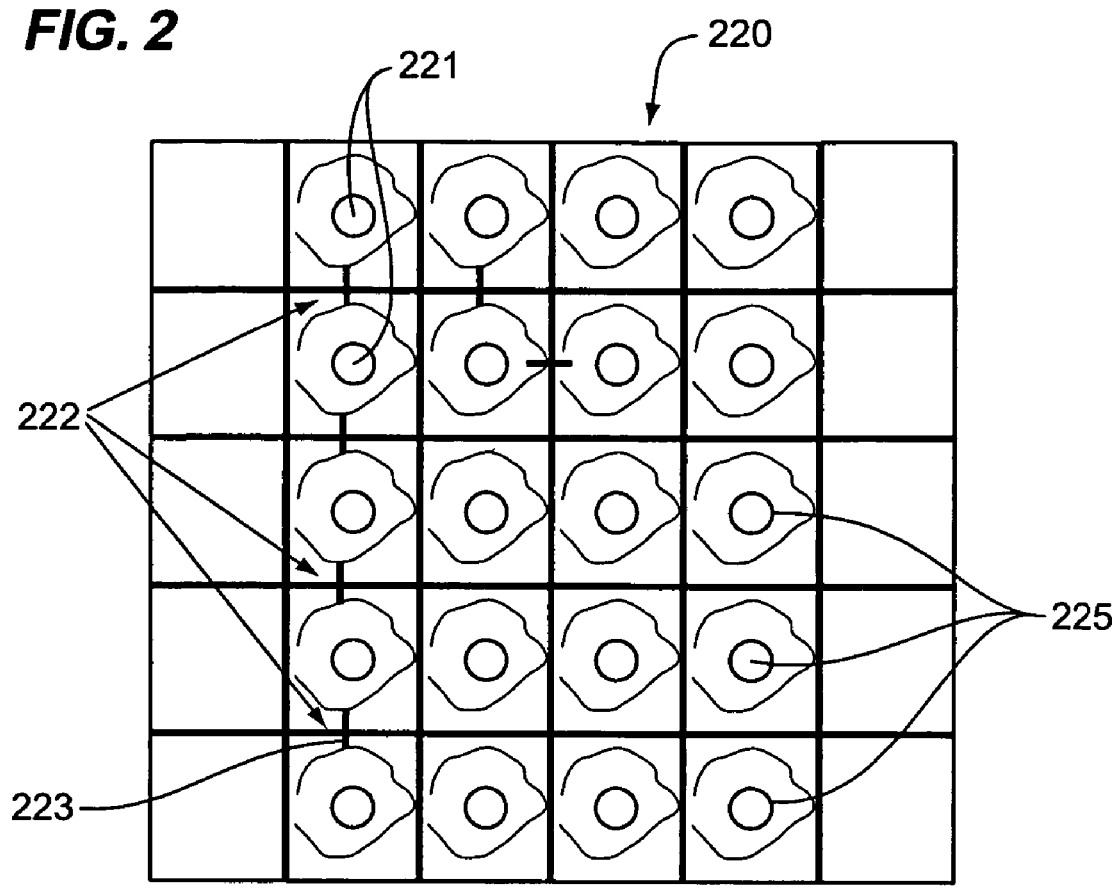

1101

SYSTEM AND APPARATUS FOR SOCKET AND PACKAGE POWER/GROUND BAR TO INCREASE CURRENT CARRYING CAPACITY FOR HIGHER IC POWER DELIVERY

RELATED APPLICATION

This application is a continuation application of U.S. application Ser. No. 09/753,327, filed Dec. 30, 2000, and the priority is claimed thereof now U.S. Pat. No. 6,992,378.

TECHNICAL FIELD

The invention relates generally to the field of Surface Mount Technology (SMT) Package and Socket Designs. More particularly, the invention relates to providing a power bar and power bar carrier for increasing power and ground current throughputs between an Integrated Circuit (IC) board and an IC chip while equalizing load and current distribution.

BACKGROUND

With the increased demand for computer functionality and speed, improvements are always being made in technologies that affect the ability of an IC board to deliver power to components that reside on the IC board. Because of manufacturing concerns, package stress factors, cost of materials, etc., each generation of technological advances provide some benefit to the existing state of technology capability and provides a segue into the next generation of technological innovation. With the advent of Surface Mount Technology ("SMT"), certain ICs that may be modified, coded or evolve in later generations, so that boards containing these ICs could be easily upgraded, created a practical upgrade and replacement problem.

The solution to this problem resulted in sockets as placeholders and carriages for these evolving ICs. The sockets are surface mounted onto the IC board during the solder re-flow and then the chips requiring socket placement are easily placed and removed from the board when required. As technologies have improved, the traces that connect the power and ground sources of the IC board to the chip have become a limitation because ICs require increasingly more power delivered through the socket. For instance, present SMT socket sizes limit the number of pins to about 800 pins. Of these 800 pins, many will be designated for I/O type signals and the rest are connected to either power or ground planes. As technologies improved for development of the IC and more computational power is attained for any given IC, bottlenecks are created by pin limitations for supplying the power from the IC board to these ever increasingly power hungry IC chips. The problem arises because even though more pins are designated for power transfer, the pin number limitation and the pin and trace size limitation impose natural restrictions on the amount of current that can be transferred across a set of multiple pins designated to a power plane. One of the primary bottleneck limitations is generated by the chip pins and the corresponding socket traces providing the power to those pins. Each pin limits the current going through the pins to between one half of an amp to one amp. Additionally, the electrical power delivery performance is limited by the area where the package pin and socket trace make contact. Because of the limited size of each pin and its corresponding contact area, the resulting resistance and inductance of the contact reduces the current delivery for each pin or provides inconsistent power transfer between one pin and another pin because of irregularities in the contact.

FIG. 12 demonstrates a prior art socket 1210 engaging an IC package 1211. All of the package pins 1201 are inserted into and engage a socket's pin receptacles 1202. A lever 1203 is used for locking the socket pins into place and forcing contact between the pins and their corresponding receptacles. Because of the small size of the pins, limited force can be applied to the pins resulting in inconsistent power transfer results. Additionally, each package pin and socket trace limits the amount of current that can be passed through the pin.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2 is a top view of a socket where several pin receptacles are electrically connected.

DETAILED DESCRIPTION

An IC socket and corresponding IC package are described for increasing the ability to transfer power from an IC board to an IC. The apparatus encompasses a socket including a power bar carrier. The power bar carrier receives a corresponding power bar incorporated on the IC package.

In the following description, for the purposes of explanation, numerous specific details are set forth in order to provide a thorough understanding of the present invention. However, the present invention may be practiced without some of the specific detail provided therein. The invention is described herein primarily in terms of a SMT socket designed to receive an IC with at least one power bar. The power bar improves current transfer while reducing contact resistance and inductance created by current power pin contact sizes.

The invention, however, is not limited to this particular embodiment alone, nor is it limited to use in conjunction with any particular combination of pins and power bars nor is it limited to use in SMT environments. For example, the claimed apparatus may be used in conjunction with any IC board where utilization of a power bar manufactured package improves power delivery to the IC and the board assembly technology supports it.

Figure 1:
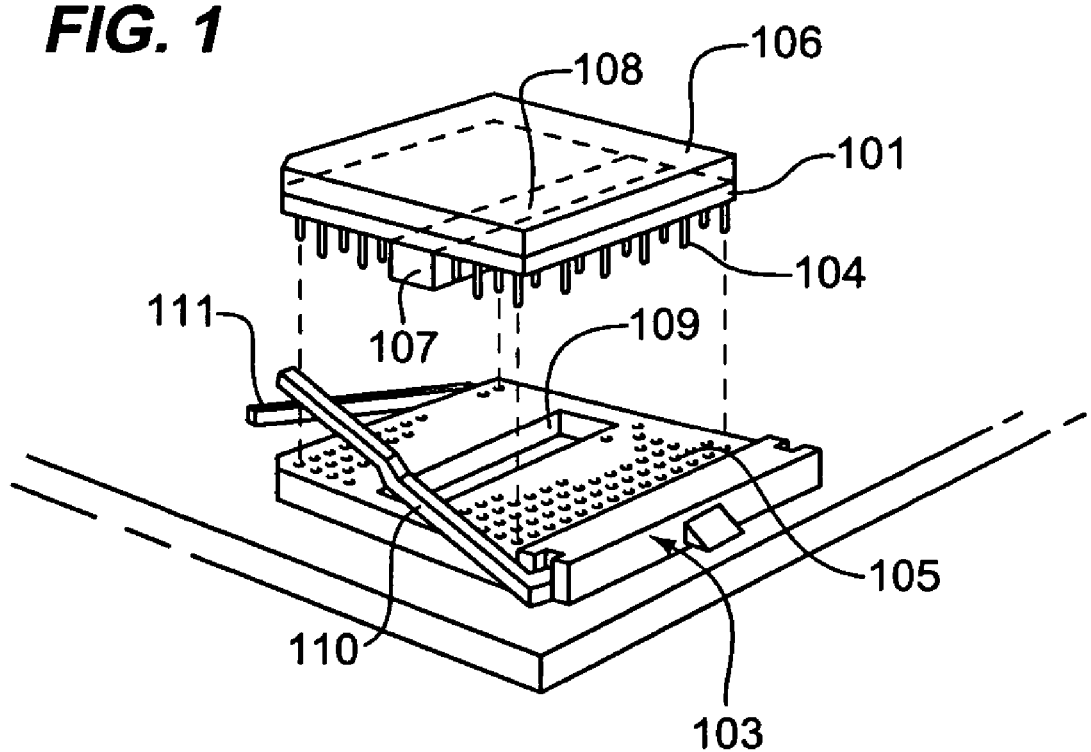
FIG. 1 is a high level depiction of a socket and an IC package according to one embodiment the invention.

FIG. 1 illustrates a high level depiction of socket and IC package according to one embodiment of the invention. An IC package 101 having a power plane (not shown) is mounted into a socket 103. The IC package 101 has multiple input/output pins 104 that are inserted into corresponding socket holes 105 for transferring and receiving informational input/output (I/O) signals necessary for the proper functional operation of the IC chip 106 integrated with the IC package 101. Although other electrically conductive materials may be used, in this embodiment a Copper (Cu) Power Bar 107 is connected to the power plane 102 along its entire adjacent border 108 and extrudes from the IC package to be inserted into a corresponding power bar carrier 109 incorporated in the socket 103. A locking mechanism 110 is employed to force the I/O the pin receptacle contacts to make contact with their corresponding pins, while a second locking mechanism 111 may be employed to separately lock the power bar carrier to the power bar.

Figure 13:
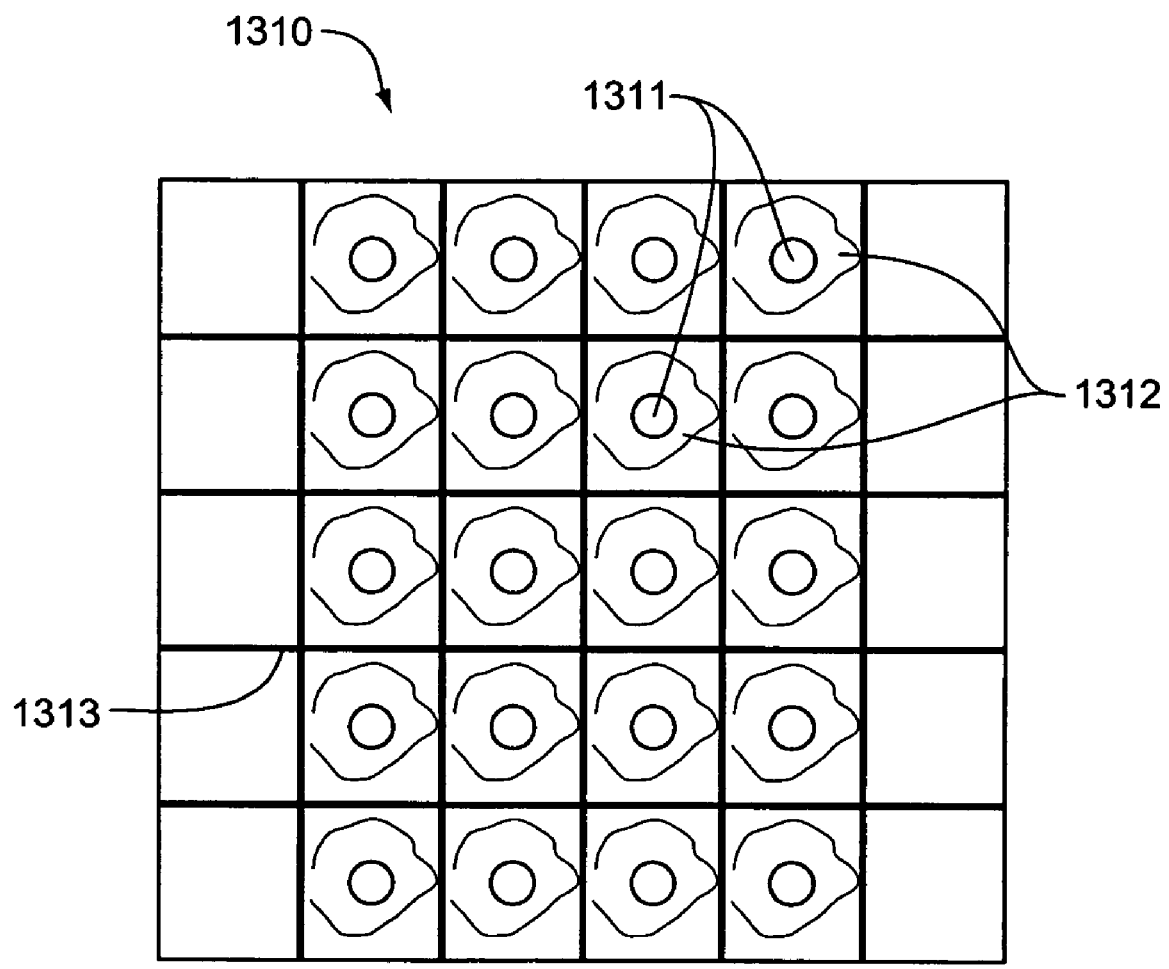
FIG. 13 is a top view of a prior art socket.

FIG. 13 is a top view of a prior art socket 1310 (the view from which the package would engage the socket) containing multiple pin receptacles 1311 that connect to pads for surface mounting on the underside of the socket. The pin receptacles 1311 each have a corresponding contact 1312 for receiving and abutting to the package pins when the IC package is engaged into the socket. An insulated socket-housing barrier 1313 prevents any contact between any of the pins 1311 and their respective contacts 1312 with any adjacent pin. The pin size has been reduced over time due to chip complexity, solder re-flow and packaging advances such as SMT and C4 technologies. Increased functionality has resulted in increased power dissipation demands by the IC device to the point where power and ground must be supplied through multiple pins. However, the pin size and the contacts between the socket pin receptacle and the package pin limit the power that may be supplied to an IC from an IC board. Additionally, the individual pins cause high non-uniform current distribution between the different pins that are utilized to supply the power to the IC package.

While FIG. 13 demonstrates the present state of the art, FIG. 2 conceptually demonstrates a portion of the philosophy behind the innovative socket and corresponding package enhancements from the socket perspective. Several pin receptacles 221 or contacts 222 designated for power transfer are electrically bound together by a shorting piece of copper 223. Although the shorting piece of copper is shown here as a trace for demonstration purposes, one embodiment contemplates several pins and their shorting piece constructed from a single copper foil so as to maximize the current surface area and distribution path. The pins may be connected in any configuration that makes sense for the design of the IC package. To accommodate the increased current capability of the new socket design, the IC package should also be modified so that a bottleneck does not occur in the pins transferring the power from the socket to the IC.

Multiple socket pin receptacles 225, that include I/O pin receptacles or other pin receptacles where current throughput is not crucial, are connected to multiple IC package pins, socket traces and contacts. Currently, each IC package pin's known current carrying capacity, whether limited by the socket pin receptacle or the IC package pin, is between 0.5 amps and 1 amp. Because pin utilization is well known in the art, a complete discussion of their construction and implementation is omitted.

Figure 3A:
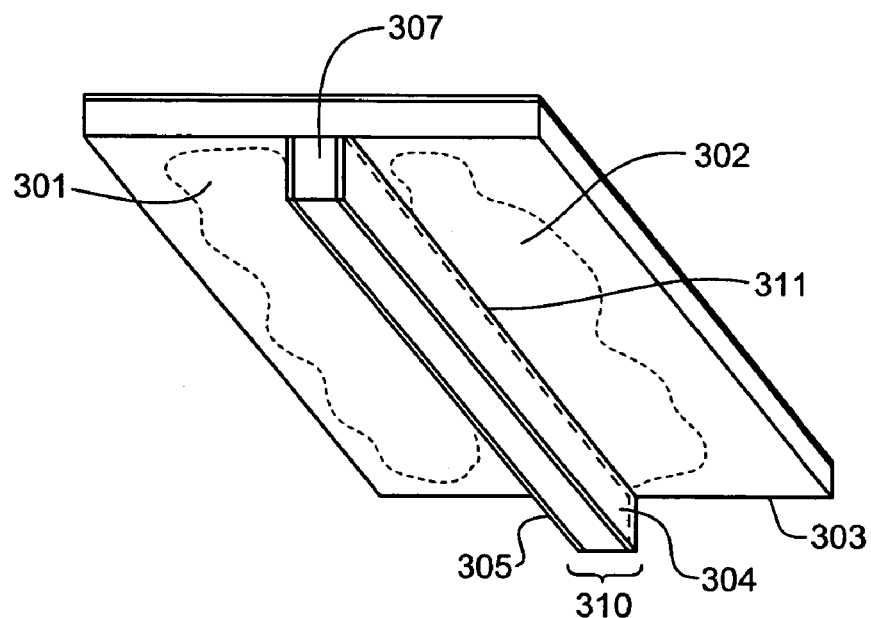
FIGS. 3a and 3b illustrate an IC package having a power bar according to one embodiment of the invention.
Figure 3B:
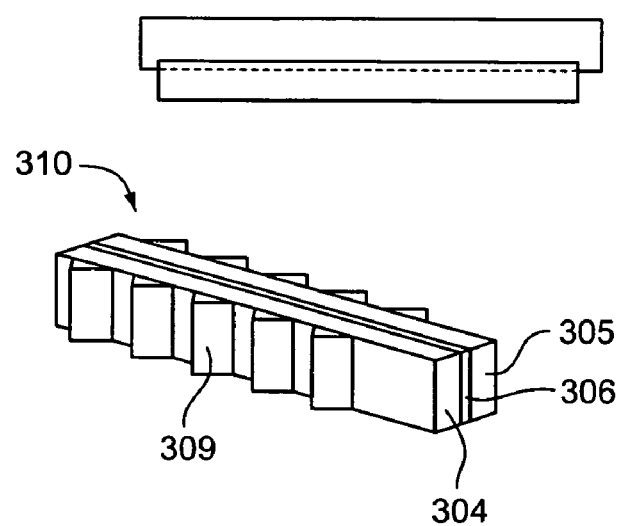

An illustrative IC Package contemplated by the invention is shown in more detail in FIGS. 3a and 3b. Although various planes or cross planes may exist in the package for holding the power and ground for the IC, FIG. 3a demonstrates two power planes, one for holding a first voltage level and one for holding a second voltage level. For simplicity these voltages levels will be referred to as power and ground. By convention, the term "power" encompasses the notion of ground and the nomenclature verbalized with reference to power planes and power bars in this invention does not deviate from that convention. Arbitrarily, the power plane 301 resides above the ground plane 302 although it is well understood that location is irrelevant. Additionally, a plane in this context is one level of copper although a plane that is not restricted to copper or a single level is contemplated. For example, a ground plane could be constructed of any conducting material and spread among several levels in the IC package 303. The ground power plane's extrusion panel 304 could connect directly to one or more of the ground planes along its entire adjacent edge 311 to the ground plane.

In this embodiment, a power bar 310 comprises two power plane extrusion panels 304 and 305 that are separated by an insulating buffer panel 306 for protecting the integrity of the power signals to be delivered by preventing short circuiting. The ground power plane extrusion panel 304 is connected along its entire adjacent bordering edge 311 to the ground power plane 302 by solder or equivalent while the power plane extrusion panel 305 is connected along its entire adjacent bordering edge to the power plane 301 via solder or equivalent. An insulation barrier panel 307 along the perpendicular circumference of the power plane extrusion panel 305 isolates the power plane extrusion panel 305 from the ground plane 302 where the power plane extrusion panel 305 penetrates or passes through the ground plane 302.

Each power or ground extrusion panel 304 or 305 of the power bar 310 may have various contact extrusions, bumps or ridges to enable intentional engaging of the IC package power bar to a socket. In this embodiment, several protrusions in the form of regularly spaced bumps or ridges 309 are integrally connected and formed as part of the power or ground extrusion panels to assist in the intentional engaging or locking in place of the IC package power bar to the socket carrier.

The power bar removes the inherent limitations of transferring power to an IC through pins by providing a larger surface and contact area. The increased surface and contact area provides substantial power delivery capabilities while also providing a uniform delivery mechanism that reduces resistance and inductance caused by multiple pins.

Figure 4:
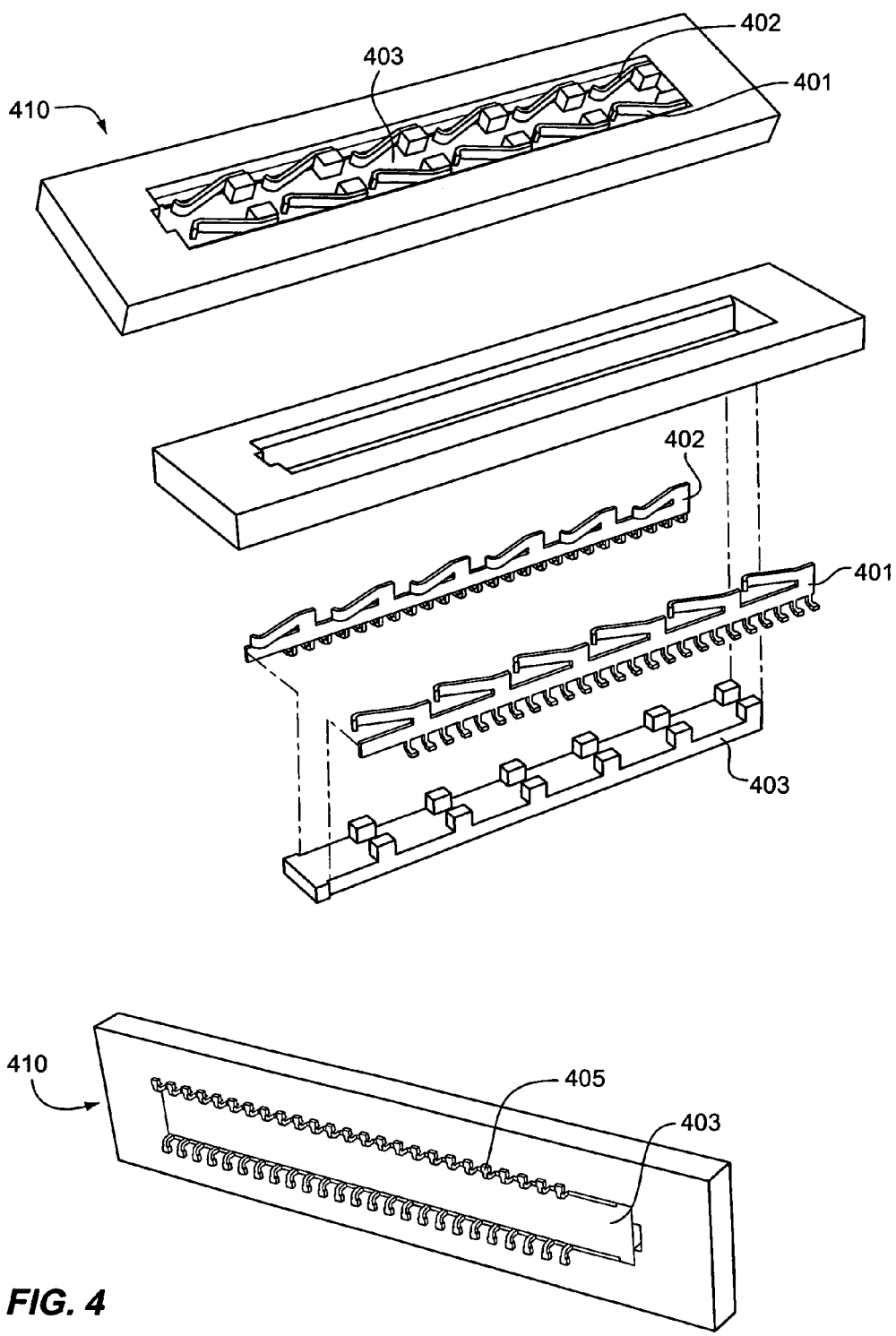
FIG. 4 is a simplified socket according to one embodiment of the invention.

FIG. 4 illustrates a power bar carrier portion of a socket according to one embodiment where the carrier 410 has two electrically conducting side panels 401 and 402 separated by a non-conductive insulation bar 403. The non-conductive insulating material may be formed from one mold or pieced together to hold the various conductive power bar carriers and pin receptacles (not shown). In this embodiment, the electrically conducting side panels 401 and 402 are separated by insulation in order to accommodate both power and ground power plane extrusion panels 304 and 305 from a package power bar. Although the power bar and the power bar carrier are shown to be a full length and straight line design, the invention contemplates any shape of power bar and corresponding power bar carrier. The power bar carrier and the power bar are always designed to carry more current than the combination of pins that it replaces. At a minimum, a power bar replaces two pins such that instead of having a bottleneck of the individual pins, the socket configuration need only have one power bar design such that a larger surface area exists where the surface area is inclusive of the size of the individual pins plus the space that would normally have been insulation between them. Optimally, although the design is not so limited, a power bar design accommodates the replacement for all pins and pin receptacles that would normally be associated with a given power plane in order to optimize current distribution, consistency and power delivery capability.

The socket may ultimately be placed on an IC board, such as a Central Processing Unit (CPU) motherboard. As the design contemplates use in a solder-flow process used by existing technologies, such as SMT, the mounting pads 405 on the bottom of the socket are produced by known methods and are spaced as required.

Figure 5:
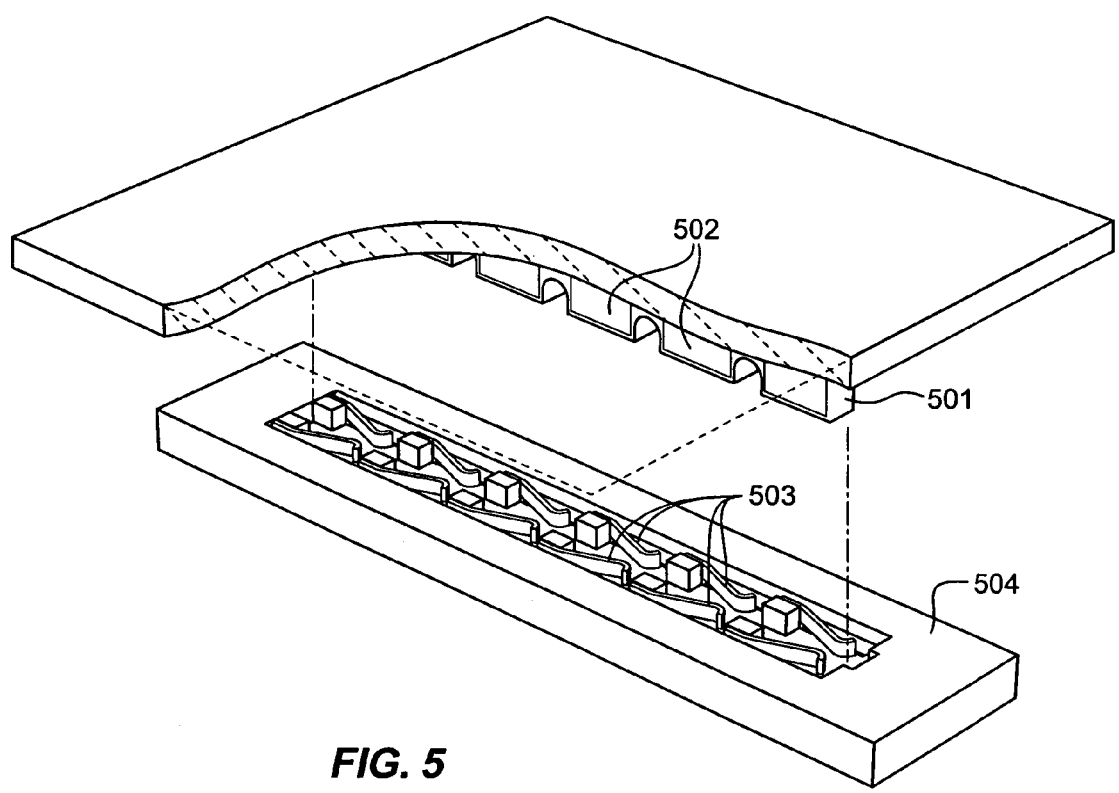
FIG. 5 demonstrates how a package power bar may be mounted in a socket carrier according to one embodiment of the invention.

FIG. 5 demonstrates how a power bar carrier may be mounted into a socket. The power bar 501 in this embodiment is made of several segments 502, each designed to correspond with contact portions 503 of a carrier 504. The power bar 501 is initially set into the carrier such that it begins in a position where no contact is made. Upon sliding the power bar into position, each of the segments align with their corresponding contacts and the spring portion of the carrier's contacts apply the force necessary to establish the electrical connection.

Figure 6:
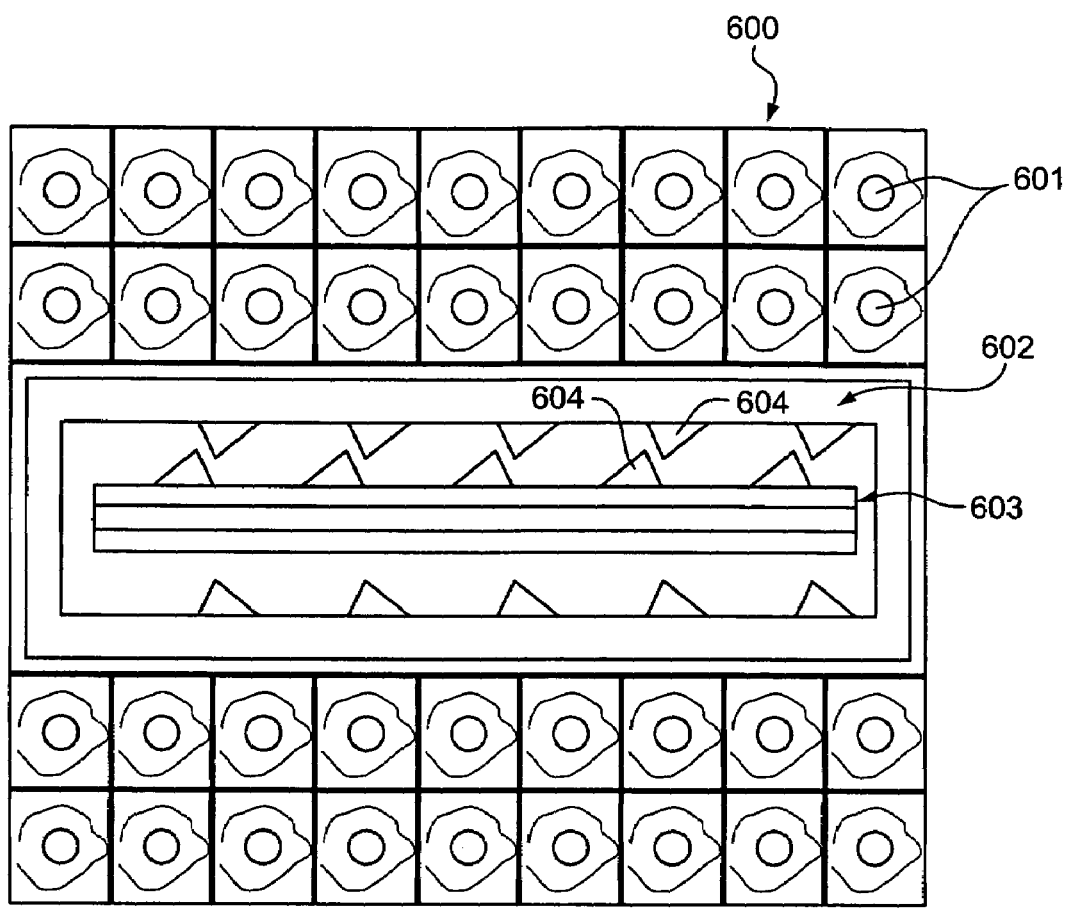
FIG. 6 is a socket with a cross-sectional view of a power bar according to one embodiment of the invention.

FIG. 6 depicts a socket 600 with several input/output (I/O) type pin receptacles 601 and a power bar carrier 602 that may be located in the center of the socket 600. A cross-sectional view of a power bar 603 detached from the package sitting in the carrier 602 is also illustrated. Although a power bar in which the entire surface of each power plane extrusion panel contacts the entire contact surface of its corresponding electrically conducting carrier panel is contemplated, this embodiment has contact bumps 604 so that the package can engage the carrier by a physical shift that aligns the carrier bumps with the power bar bumps as demonstrated in FIGS. 7a and 7b.

Figure 7A:
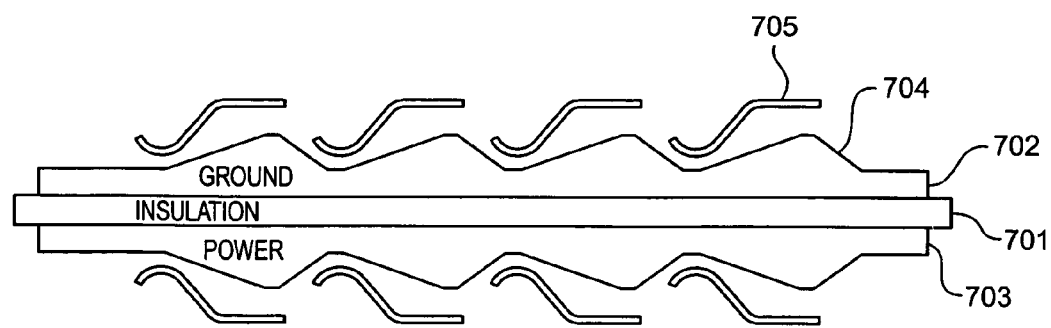
FIGS. 7a and 7b demonstrate a carrier engaging a power ba according to one embodiment of the invention r.
Figure 7B:
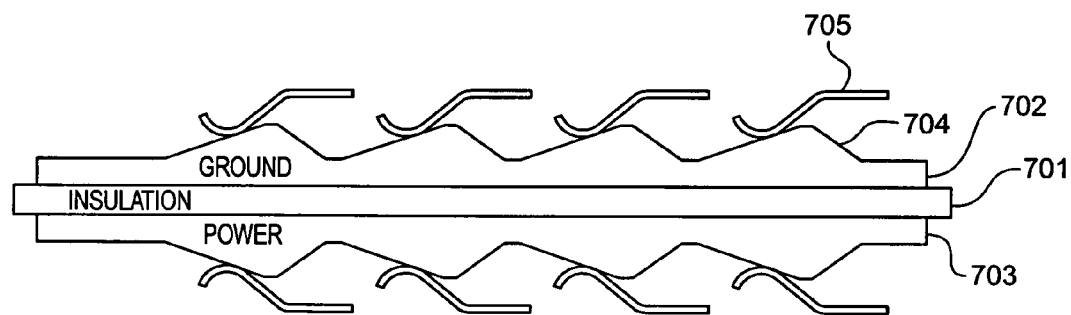

FIGS. 7a and 7b show a power bar 701 with power and ground plane extrusion panels 702 and 703 having contact bumps 704 and the extruding contact bumps or bent contact spring elements 705 of the carrier's corresponding carrier foil. FIG. 7a shows the power bar before it is engaged with the socket carrier and FIG. 7b illustrates the power bar engaged with the socket carrier bumps. Because the power bar may have a different alignment with the socket carrier than the I/O pins to the I/O pin receptacles, as demonstrated in FIG. 1, the engagement shift 111 for the power bar may be performed independently of the I/O pin engagement 110 for the package to the socket. For instance, two activation mechanisms may exist on the socket to engage the various types of receptacles. Similarly, a single activation mechanism (not shown) may be used to engage the package pins while another activation mechanism capable of applying pressure in a different direction may cause the power bar to engage with the carrier. A discussion of how an activation mechanism causes a socket to engage a corresponding package is omitted because such mechanisms are well known in the art. In order to deliver the power efficiently, thereby reducing contact resistance and inductance, the shape of the contacts and the power bar can be different from those utilized for the pins. By separating the activating mechanisms, more contact force may be applied to the power delivery contacts of the power bar mechanism to further improve electrical performance. Although separate activation methods have been described, a single activation mechanism that applies necessary force for the pins and power bar's respective engagement is also contemplated.

Figure 8:
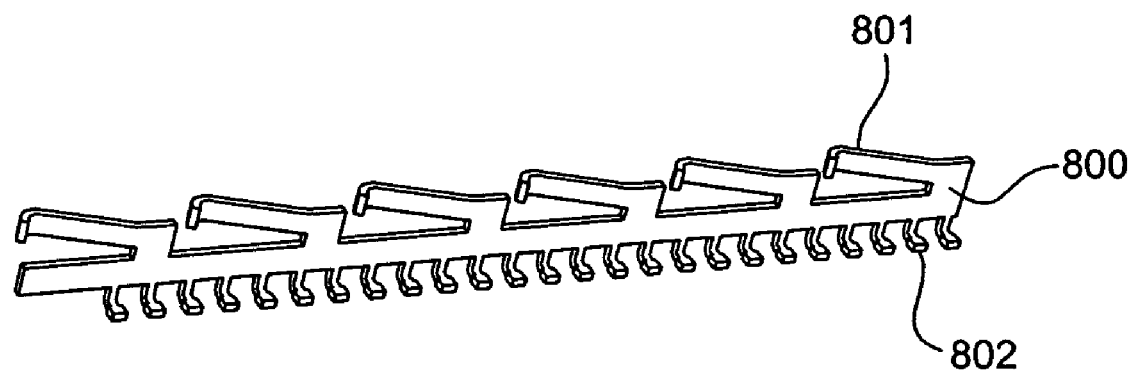
FIG. 8 is an example of how a carrier side may be stamped from an electrically conducting foil according to one embodiment of the invention.
Figure 9:
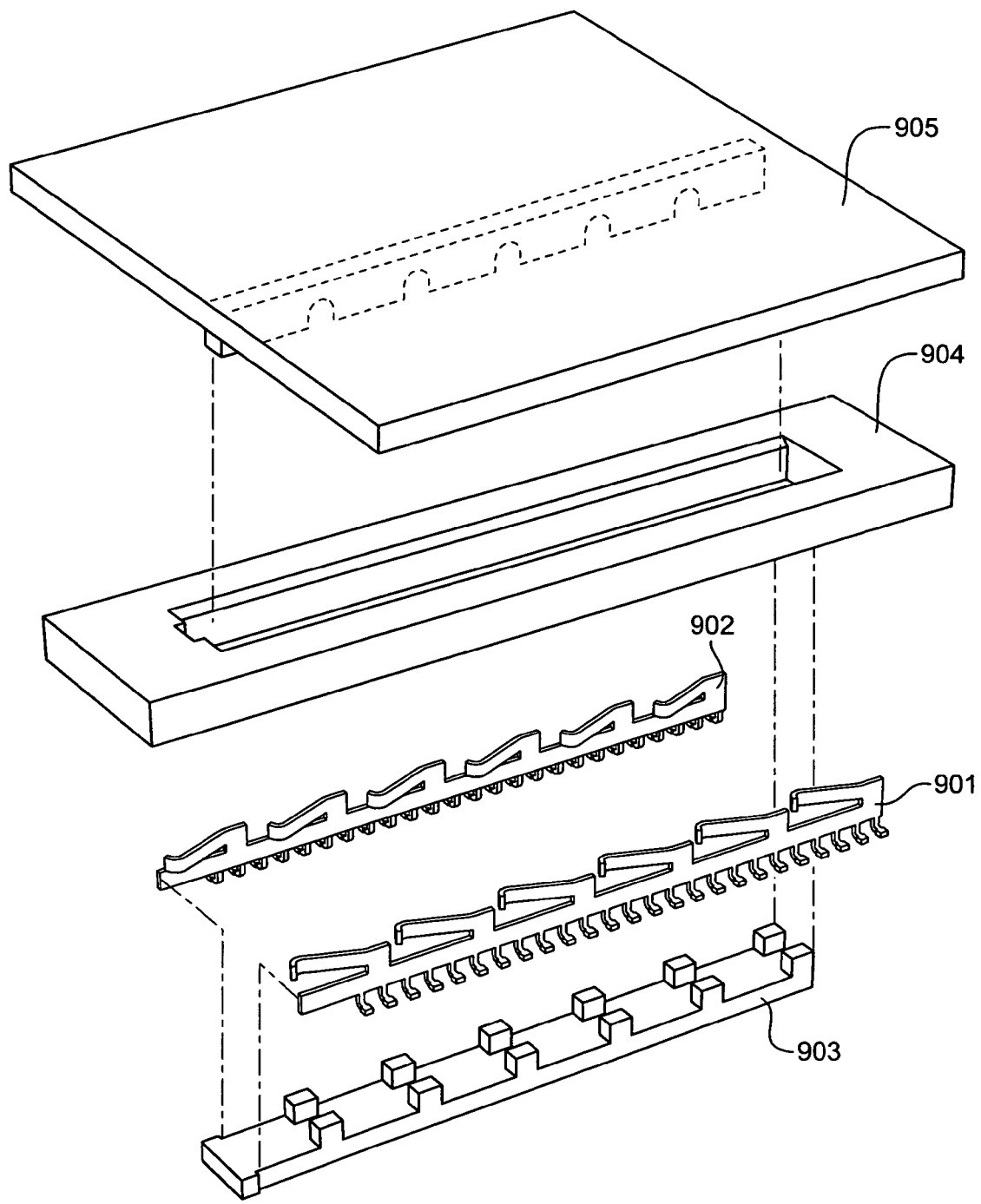
FIG. 9 illustrates how two foils may be mounted with insulation to form a carrier according to one embodiment of the invention.

FIG. 8 shows an example of how a copper or other electrically conducting foil 800 may be stamped to produce one of the carrier's conducting panels. In this example, carrier panel contacts 801 for connecting to the power bar bumps are cut and bent to provide enough tension to produce a frictional engagement of the power bar. This type of bending of a conducting material is known to produce a spring constant that may be efficiently accessed in the type of engagement mechanism contemplated. The BGA pads are connected to extrusions 802 stamped at the base of the foil to provide for a SMT soldering of the socket to an IC board. Two foils 901 and 902 similar to those shown in FIG. 8 are sandwiched in an insulating material 903 along their main conducting surfaces as shown in FIG. 9. The entire carrier is then connected into a power bar socket 904 which is then capable of receiving a corresponding power bar package 905.

Figure 10:
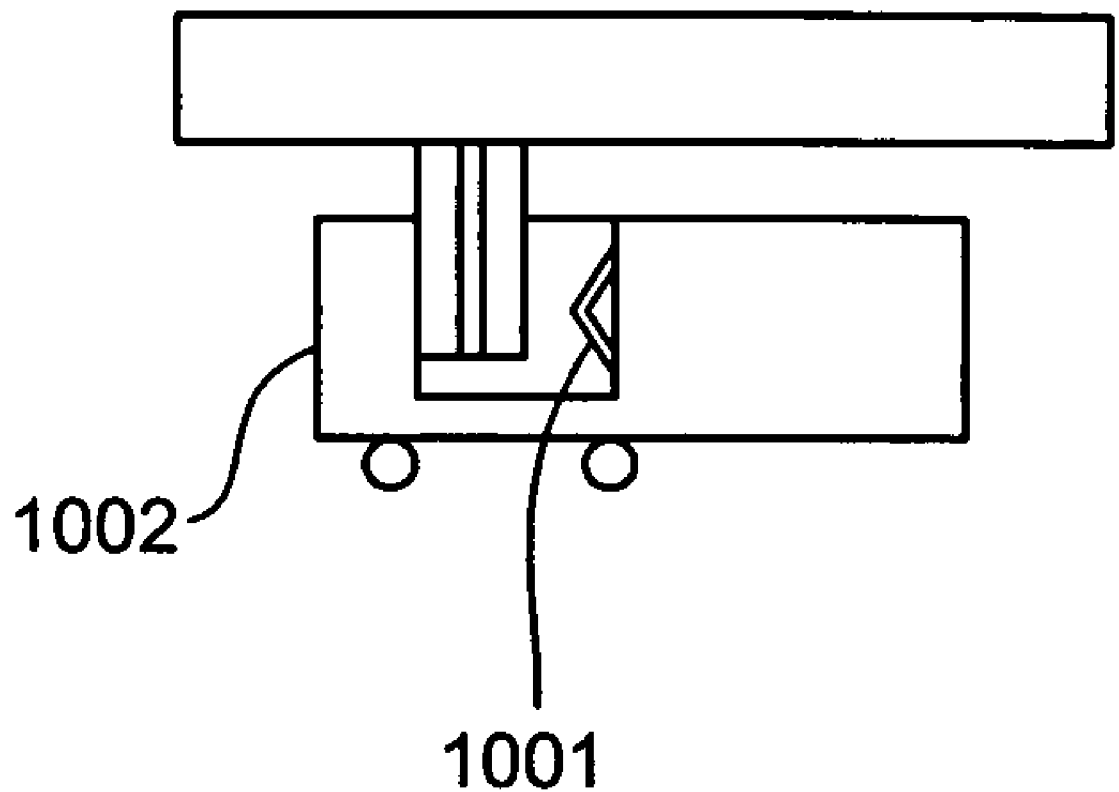
FIGS. 10 and 11 show alternative activation mechanisms for a carrier to engage a power bar according to one embodiment of the invention.
Figure 11:
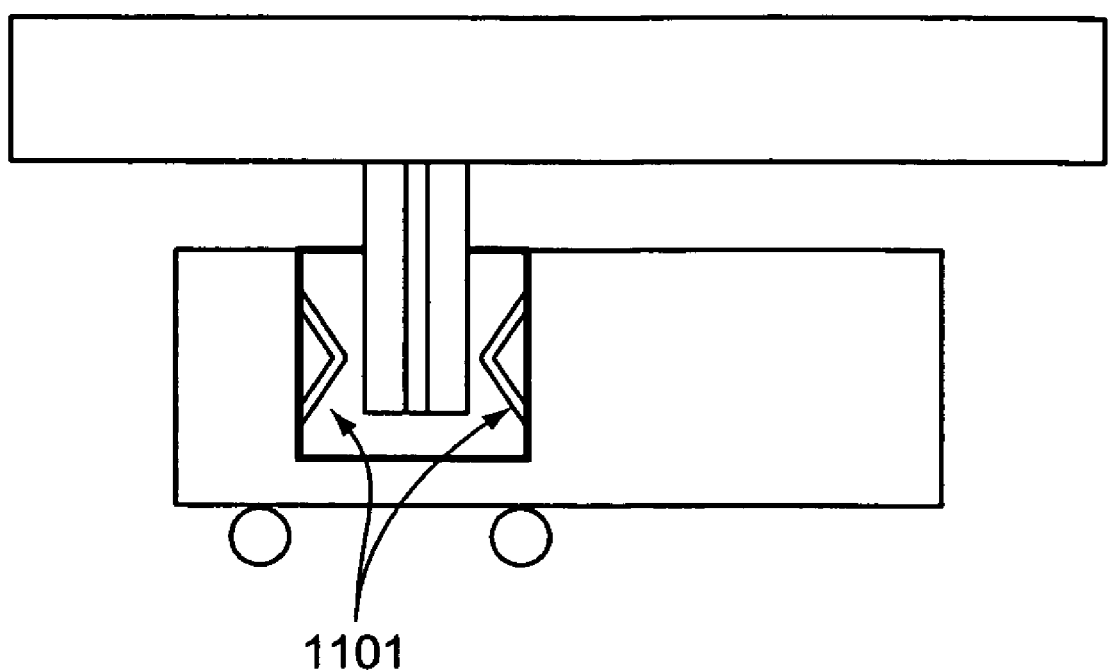
Figure 12:
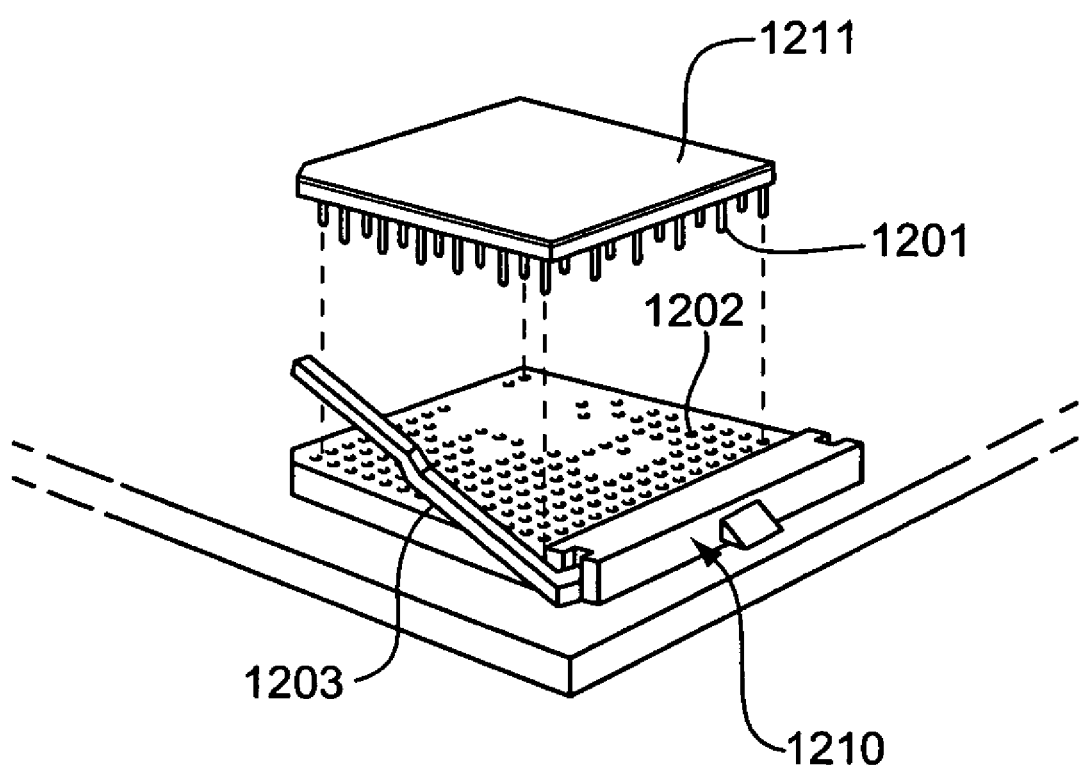
FIG. 12 provides a prior art socket engaging a prior art package.

FIGS. 10 and 11 demonstrate two alternative embodiments where the power bar is engaged by a spring type mechanism, here a bent carrier panel. In FIG. 10, a single spring 1001 applies the contact for one power plane extrusion of the power bar while pressing the power bar into contact with the other carrier side 1002. Alternatively, FIG. 11 demonstrates a carrier employing two bent spring panels 1101 to engage the respective panels of the power bar.

The foregoing description has demonstrated several embodiments of the invention. It is understood, however, that the invention need not be limited to any specific embodiment and that all examples are only illustrative. Numerous other embodiments that are limited only by the scope and language of the claims are contemplated as would be obvious to someone possessing ordinary skill in the art and having the benefit of this disclosure.

What is claimed is:

1. An integrated circuit (IC) package comprising:
   a first power plane;
   a power bar attached to a center of an outer surface of the IC package, and surrounded by Input/Output pins formed on the periphery of the outer surface;
   a power bar carrier and one or more pin receptacles, the power bar carrier including a first conducting panel electrically coupled to the first power plane along a first adjacent edge, the first conducting panel further electrically coupled to a first plurality of conducting pads;
   a first activation mechanism exerting a first force engaged with the power bar of the corresponding IC package; and
   a second activation mechanism exerting a second force engaged with the one or more pins, wherein the first force and the second force are substantially equivalent.

2. The IC package of claim 1, further comprising:
   a second power plane electrically isolated from the first power plane; and
   a second conducting panel electrically connected to the second power plane of the IC package along a second adjacent edge.

3. The IC package of claim 1, wherein the power bar comprises a non-conducting insulation panel separating the first conducting panel from the second conducting panel.

4. The IC package of claim 3, wherein the power bar further comprises one or more conducting bumps electrically connected to the first conducting panel.

5. The IC package of claim 3, wherein the power bar further comprises one or more conducting bumps electrically connected to one or more of the first conducting panel and the second conducing panel.

6. An integrated circuit (IC) power delivery system including an IC package; and
   a power bar attached to a center of an outer surface of the IC package, and surrounded by Input/Output pins formed on the periphery of the outer surface, the IC power delivery system comprising:
   a first power plane;
   a second power plane electrically isolated form the first power plane;
   an IC socket having a power bar carrier and one or more receptacles, wherein the power bar carrier includes a first conducting panel electrically coupled to the first power plane along a first adjacent edge;
   a first activation mechanism exerting a first force engaged with the power bar of a corresponding IC package;
   a second activation mechanism exerting a second force engaged with the one or more pins, wherein the first force and the second force are substantially equivalent; and
   the first conducting panel further electrically coupled to a first plurality of conducting pads.

7. The IC power delivery system of claim 6, further comprising a second conducting panel electrically coupled to the second power plane along a second adjacent edge.

8. The IC package of claim 6, wherein the power bar comprises a non-conducting insulation panel separating the first conducting panel from the second conducting panel.

9. The IC package of claim 8, wherein the power bar further comprises one or more conducting bumps electrically connected to the first conducting panel.

10. The IC package of claim 8, wherein the power bar further comprises one or more conducting bumps electrically connected to one or more of the first conducting panel and the second conducing panel.

* * * * *